United States Patent
Lee et al.

[11] Patent Number: 6,063,201
[45] Date of Patent: May 16, 2000

[54] EFFUSION CELL ASSEMBLY FOR EPITAXIAL APPARATUS

[75] Inventors: Hae Gwon Lee, Chungcheongnam-do; Gyu Hwan Sim, Daejon; Sung Woo Choi, Daejeon; Mun Cheol Baek, Daejeon; Kee Soo Nam, Daejeon, all of Rep. of Korea

[73] Assignee: Electronics and Telecmmunications Research Institute, Daejeon-shi, Rep. of Korea

[21] Appl. No.: 09/141,557

[22] Filed: Aug. 28, 1998

[30] Foreign Application Priority Data

Nov. 28, 1997 [KR] Rep. of Korea .................. 97-64079

[51] Int. Cl.[7] .................................................. C23C 16/00
[52] U.S. Cl. .................................... 118/719; 118/726
[58] Field of Search ........................... 118/726, 719

[56] References Cited

U.S. PATENT DOCUMENTS

| | | | |
|---|---|---|---|
| 4,518,846 | 5/1985 | Freeouf | 118/726 |
| 5,041,719 | 8/1991 | Harris | 118/726 |
| 5,253,266 | 10/1993 | Knodle | 118/726 |
| 5,827,371 | 10/1998 | Colombo | 118/726 |

*Primary Examiner*—Richard Bueker
*Attorney, Agent, or Firm*—Jacobson, Price, Holman & Stern, PLLC

[57] ABSTRACT

An effusion cell assembly for epitaxial apparatus is disclosed. The assembly includes an effusion cell inclung a growing material, a heater for supplying heats with the effusion cell to effuse the growing material, a supporting plate for supporting the heater, a bolt having one end connected to the supporting plate, a cell flange coupled to a lower flange of an adaptor for supporting the cell assembly, bellows fixed between the supporting plate and the cell flange including the bolt, and a control nut for expanding and contracting the bellows so as to separate only the cell assembly from a vacuum chamber with entire vacuum maintained in the vacuum chamber and local vacuum released in the cell assembly. The epitaxial apparatus further includes a control valve located between an entrance flange of the vacuum chamber and an upper adaptor flange of the adaptor for introducing and maintaining vacuum in the vacuum chamber.

5 Claims, 6 Drawing Sheets

EFFUSION CELL ASSEMBLY FOR EPITAXIAL APPARATUS

BACKGROUND OF THE INVENTION

1. Field of the Invention

The present invention relates generally to an effusion cell assembly installed in an epitaxial apparatus, and particularly an effusion cell assembly for epitaxial apparatus capable of easily assembling and disassemblying a cell assembly with entire vacuum maintained in a vacuum chamber.

2. Description of Related Art

Generally, a cell assembly of the epitaxial apparatus, i.e., effusion cell emits effusion vapors by heating raw material in an ultra vacuum chamber, in which a heating coil is wound around the cell and the raw material in the cell is heated and effused by applying current to the heating coil. In such a molecular monocrystal growing apparatus, its quality of the produced product is influenced by an amount of included impurity, and its degree of vacuum in the ultra vacuum apparatus depends on the amount of impurity included in the vacuum chamber. Since the degree of vacuum determines the quality of monocrystal material, i.e., semiconductor material, it is very important to prevent contamination in the, vacuum chamber.

Particularly, the ultra high vacuum apparatus, i.e., molecular epitaxy apparatus have to maintain a state of ultra very vacuum in view of its characteristic, and minimize, in the vacuum chamber, inflow of general atmosphere materials, i.e., air and elements adhered inside the epitaxial apparatus and influenced on the vacuum. When growing atomic unit of monocrystal using the above apparatus, since it necessary to minimize the impurity, its exposed time in the atmosphere must be minimized in any case and its exposal must be prevented, if possible.

Prior art epitaxial apparatus having the effusion cell is now explained with reference to FIG. 1.

As shown in FIG. 1, the effusion cell 10, which material to be grown is filled, is installed at one end of the vacuum chamber 1, and an adaptor 4 for coupling the cell assembly in the vacuum chamber is located between an entrance flange 2 of the vacuum chamber 1 and a cell flange 7. The adaptor 4 has a pair of flanges 3 and 6 at both sides to connect between the entrance flange 2 of the vacuum chamber 1 and the cell flange 7, in which a lead-in duct a for supporting the effusion cell 10 in the vacuum chamber 1 and a liquid nitrogen wall 9 for surrounding the lead-in duct 8 are installed through the adaptor 4 inside the vacuum chamber 1.

In such an epitaxial apparatus, the prior art effusion cell assembly has the effusion cell 10 filled with the growing material, a heater 11 for supplying heats to effuse the growing material, the lead-in duct 8 for supporting the heater 11, and the cell flange 7 for fixing the lead-in duct 8 and coupling the adaptor flange 6 as shown in FIG. 2.

In the above epitaxial apparatus, if the raw material filled in the effusion cell is drained, after disassemblying the respective flanges connected through the adaptor flange and releasing the vacuum, it required that the cell be separated from the vacuum apparatus and be exposed in the atmosphere to charge the raw material.

That is, when the growing material is charged again and the broken call is repaired, though both the cell and the heater are small, all the vacuum in the vacuum apparatus must be released.

Such a vacuum breakdown causes the air to inflow in the vacuum chamber, so that impurities in the air are adhered inside the vacuum chamber and thus, the impurites may be adhered to, for example, semiconductor substrate when, using the vacuum apparatus. The undesired impurites deteriorate the quality of products and use of the produced products is impossible.

SUMMARY OF THE INVENTION

An object of the present invention is to provide an effusion cell assembly for epitaxial apparatus capable of minimizing contamination of the epitaxial apparatus and time of state recovery with entire vacuum maintained in a vacuum chamber and local vacuum released in the cell by variably controlling length of a lead-in duct supported in the cell flange when charging the raw material and repairing the cell assembly.

An another object of the present invention is to provide an effusion cell assembly for epitaxial apparatus capable of easily charging the raw material and repairing the cell assembly without influence on vacuum in a vacuum chamber by simply assemblying and disassemblying only the cell assembly.

To achieve the above object, the present invention discloses an effusion cell assembly for epitaxial apparatus comprising an effusion cell incluing a growing material; a heater for supplying heats with the effusion cell to effuse the growing material; a supporting plate for supporting the heater; a bolt having one end connected to the supporting plate; a cell flange coupled to a lower flange of an adaptor for supporting the cell assembly; bellows fixed between the supporting plate and the cell flange including the bolt; and bellows expanding/contracting means for expanding and contracting the bellows so as to separate only the cell assembly from a vacuum chamber with entire vacuum maintained in the vacuum chamber and local vacuum released in the cell assembly; the epitaxial apparatus further comprising opening and closing means located between an entrance flange of the vacuum chamber and an upper adaptor flange of the adaptor for maintaining vacuum in the vacuum chamber and introducing the vacuum in the vacuum chamber.

According to the present invention, the opening and closing means comprises a gate valve.

The vacuum chamber is shut from outside if the gate valve is open.

The bellows expanding/contracting means comprises the bolt having one end connected to the supporting plate and the other end passing the cell flange for expanding and contracting the bellows according to a variable action of the bolt.; a control supporting plate fixed below the cell flange and having a through hole for the bolt; and a control nut coupled under the control supporting plate for controlling an inserted length of the bolt according to a rotational direction of the control nut.

According to the present invention, the cell assembly further comprises guiding means having one end connected to the supporting plate and the other end passing through the control supporting plate for guiding a linear movement of the bolt.

BRIEF DESCRIPTION OF THE DRAWINGS

Other features and objects of the present invention will be apparent from the following description in connection with the accompanying drawings.

DETAILED DESCRIPTION OF THE PREFERRED EMBODIMENTS

An effusion cell assembly according to an embodiment of the present invention will now be described in detail with reference to the attached FIG. 3 to FIG. 6.

The effusion cell assembly for epitaxial apparatus according to an embodiment of the present invention is to minimize contamination of a vacuum chamber by simply assemblying and disassemblying only a cell assembly with entire vacuum maintained in the vacuum chamber and local vacuum released in the cell when charging the raw material and repairing the cell assembly.

Figure 1:
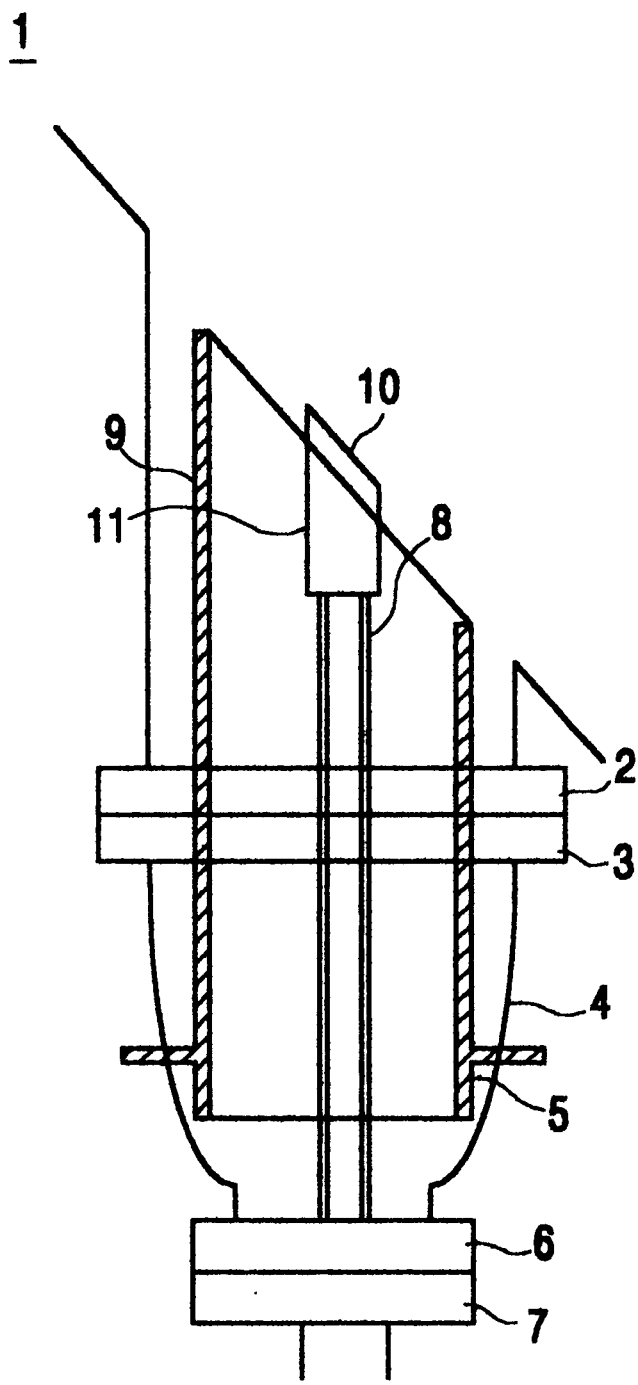
FIG. 1 is a schematic diagram showing a structure of a general epitaxial apparatus.
Figure 2:
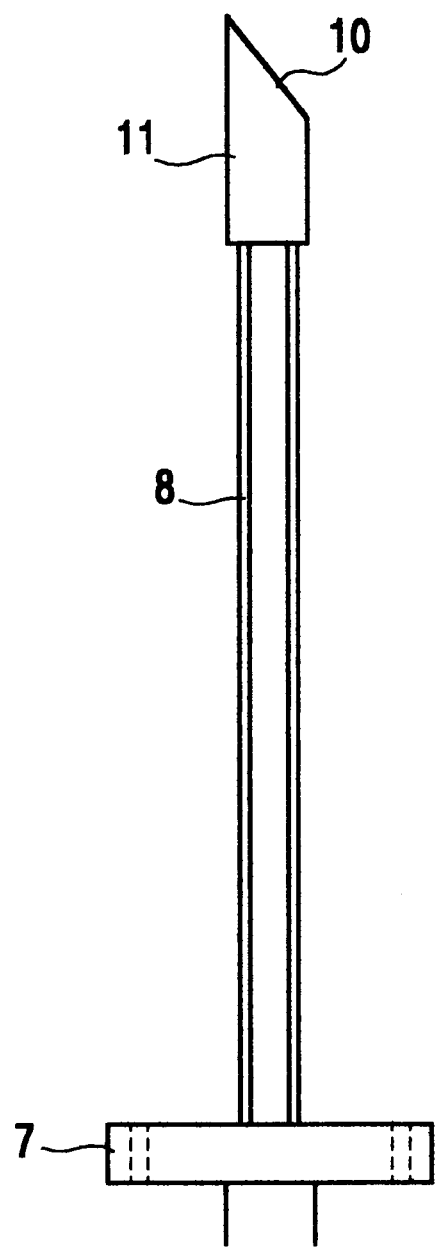
FIG. 2 is a diagram showing a prior art effusion cell assembly.
Figure 3:
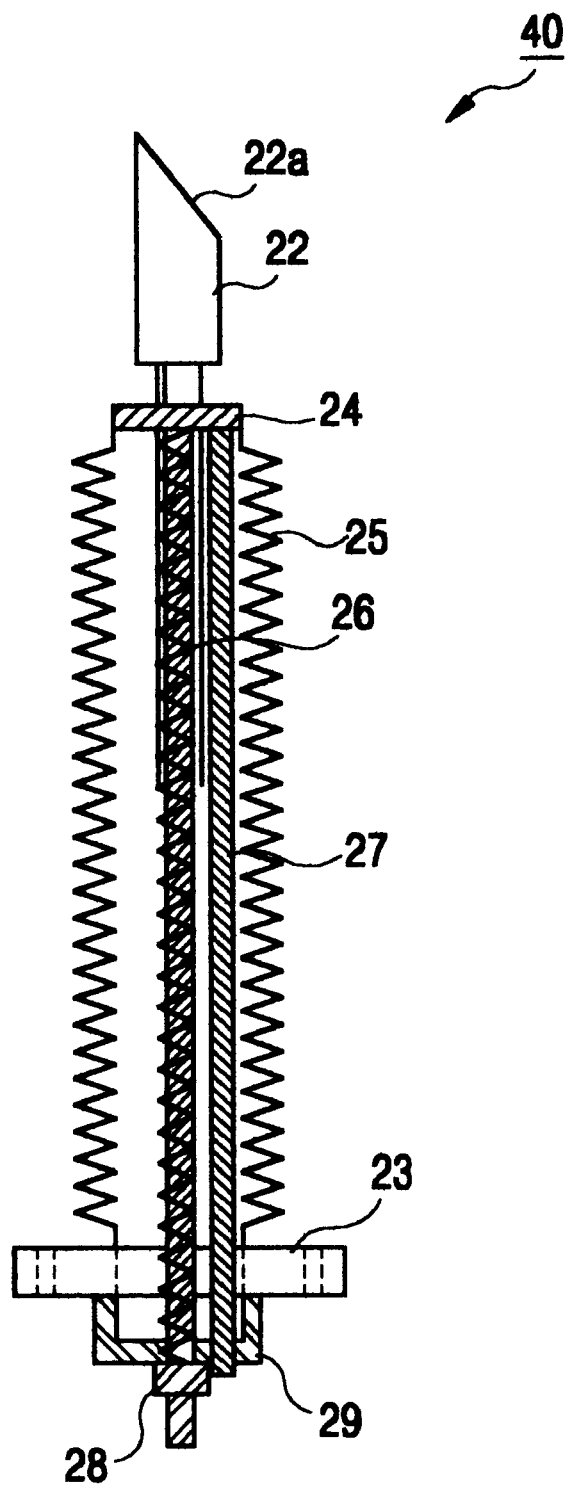
FIG. 3 is a diagram showing a structure of an effusion cell assembly for epitaxial apparatus according to an embodiment of the present invention.
Figure 4:
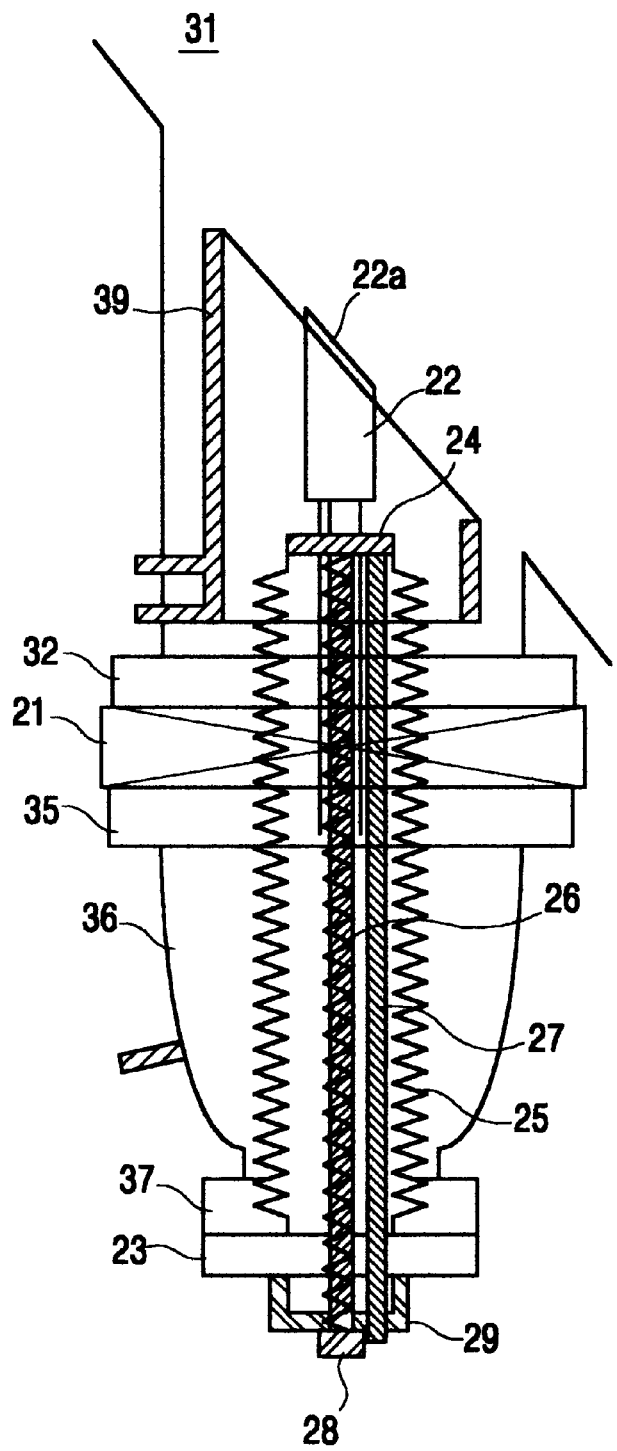
FIG. 4 is a schematic diagram showing the structure that the effusion cell assembly is installed in the vacuum chamber.

Referring to FIGS. 3 and 4, the effusion cell assembly includes a gate valve 21 located between an entrance flange 32 of a vacuum chamber 31 and an one adaptor flange 35 for maintaining vacuum in the vacuum chamber 31 by separation from outside and introducing the vacuum in the vacuum chamber 31, an effusion cell 22a incluing a growing material, a heater 22 for supplying heats to effuse the growing material, a supporting plate 24 for supporting the heater 22, a bolt 26 having one end connected to the'supporting plate 24, a cell flange 23 for coupling a lower flange 37 of an adaptor 36, and bellows 25 for expanding and contracting its body so as to separate only the cell assembly from the vacuum chamber 31 with entire vacuum maintained in the vacuum chamber 31 and local vacuum released in the cell.

In this case, both ends of the bellows 25 are welded-fixed to both the supporting plate 24 and the cell flange 23.

Further, bellows expanding/contracting means has one end connected to the supporting plate 24 and the other end connected through the cell flange 23. The bellows expanding/contracting means includes the bolt 26 having a predetermined length, a control supporting plate 29 welded below the cell flange 23 and having a through hole for the bolt 26, and a control nut 28 coupled under the control supporting plate 29 for controlling the length of the bolt 26, thereby varying the length of the bolt 26 according to a rotational direction of control nut 28 to expand and contract the bellows 25.

Also, the cell assembly also includes a guide bar 27 having one end connected to the supporting plate 24 and the other end passing through the control supporting plate 29, which guides a movement of the cell flange 23 according to a variable action of the bolt 26.

An operation of the effusion cell assembly installed in the vacuum chamber will now be described in detail with reference to FIG. 4 to FIG. 6.

As shown in FIG. 4, the gate valve 21 is connected through entrance flange 32 and the one adaptor flange 35 between the vacuum chamber 31 and the adaptor 36. In this case, a liquid nitrogen wall 39 is installed outside the heater 22 in the vacuum chamber 31.

To the other adaptor flange 37 of adaptor 36 is coupled the cell flange 23 for supporting the cell assembly. In this case, the effusion cell 22a and heater 22 of the cell assembly 40 are coupled to be projected through the adaptor flanges 35 and 36, the gate valve 21, and the entrance flange 32 into the vacuum chamber 31.

Further, if the gate valve 21 is closed, both the vacuum chamber 31 and adaptor 36 are separated and maintained in the vacuum state. If the gate valve 21 is open, both the vacuum chamber 31 and adaptor 36 are maintained in the vacuum state due to the bellows 25 and the cell flange 23.

Figure 5:
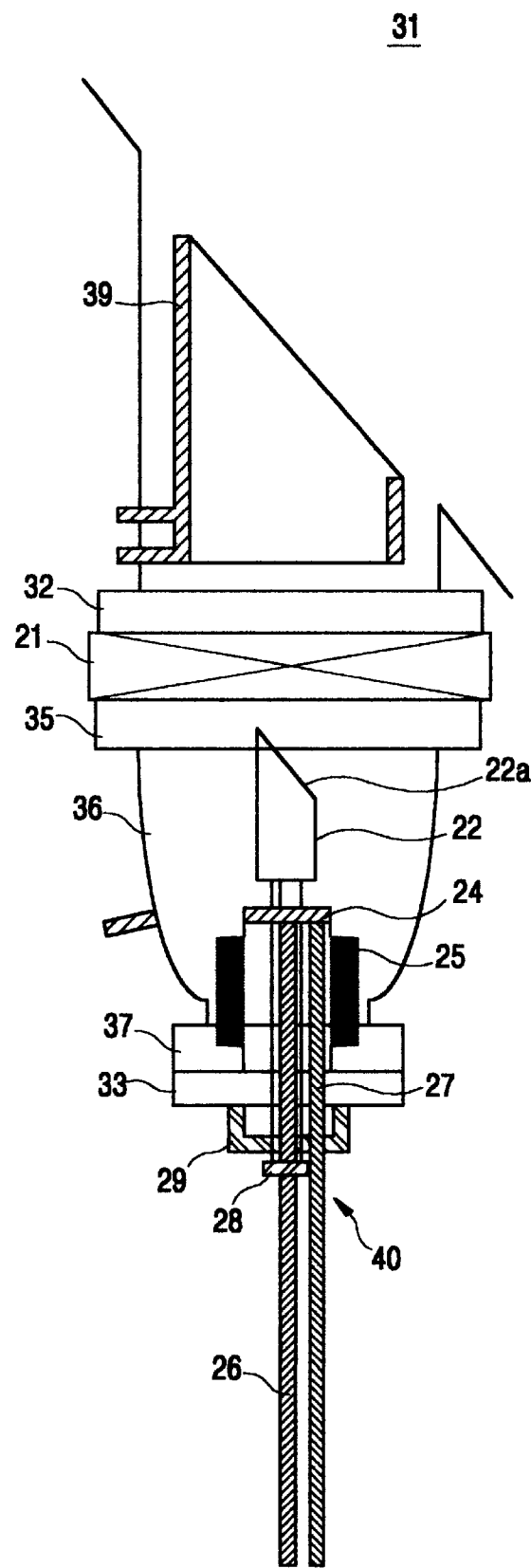
FIG. 5 and FIG. 6 are views of explaining separation of the effusion cell assembly for epitaxial apparatus in FIG. 4.

If separating the cell assembly 40 from the vacuum chamber 31, the control nut 28 rotates with the gate valve 21 open as shown in FIG. 5. Since the rotational force of the control nut 28 acts as force of pulling up the bolt 26, the bolt 26 and the guide bar 27 are projected through the control supporting plate 29 outside, so that the bellows 25 are pulled up to contract the bellows 25, thereby separating the effusion cell 22a from the vacuum chamber 31.

Figure 6:
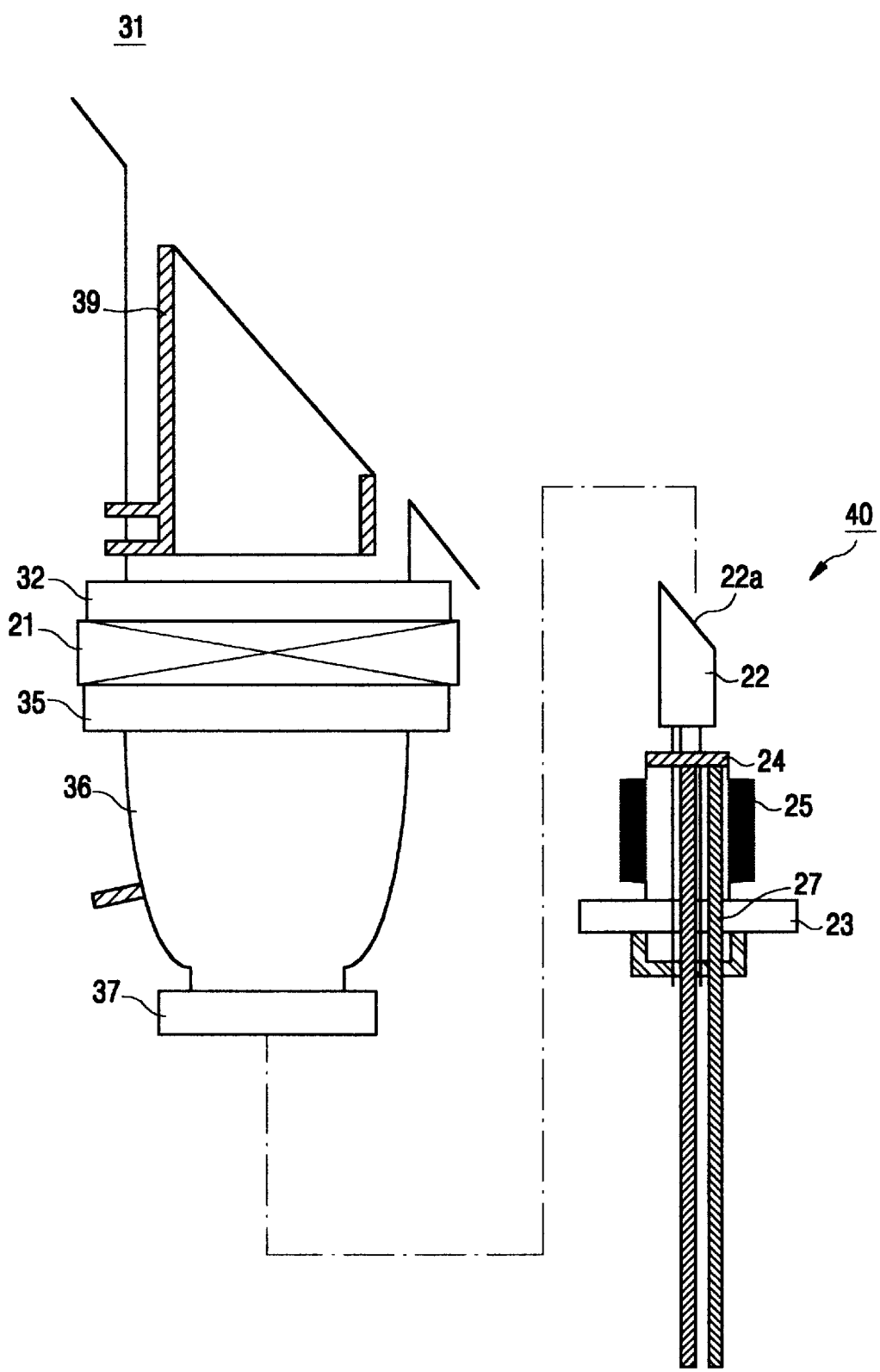

Subsequently, as shown in FIG. 6, with the gate valve 21 closed, after getting off the vacuum of the adaptor 36, the cell assembly 40 is separated from the adaptor 36 outside so as to charge the raw material or to repair any broken components.

Assemblying the cell assembly 40 in the vacuum chamber 31 is executed in the contrary order with vacuum maintained in the vacuum chamber 31. That is, the cell flange 23 is coupled to the adaptor 36 with the vacuum maintained in the vacuum chamber 31 by closing the gate valve 21 and then, the control nut 28 rotates in the direction contrary to the separation direction with the gate valve 21 open, so that the bolt 26 and guide bar 27 together with the effusion cell 22a are inserted through the gate valve 21 in the vacuum chamber 31 and thus, the bellows 25 are expanded. Finally, the gate valve 21 is closed.

As mentioned above, the effusion cell assembly for epitaxial apparatus according to an embodiment of the present invention is to minimize contamination of the vacuum chamber by simply assemblying and disassemblying only the cell assembly with vacuum maintained in the vacuum chamber and vacuum released in the local portion by expanding and contracting the bellows by means of the control nut when charging the raw material and repairing the cell assembly. Further, it is possible to shorten time to repair and charge the cell and to maintain the entire vacuum in the vacuum chamber.

Although the invention has been described with reference to particular embodiments, the description is only an example of the invention's application and should not be taken as a limitation. Various adaptation and combinations of features of the embodiments disclosed are within the scope of the invention as defined by the following claims.

What is claimed is:

1. An effusion cell assembly for epitaxial apparatus comprising:

an effusion cell incluing a growing material;

a heater for supplying heat with the effusion cell to effuse the growing material;

a supporting plate for supporting the heater;

a bolt having one end connected to the supporting plate;

a cell flange coupled to a lower flange of an adaptor for supporting the cell assembly;

bellows fixed between the supporting plate and the cell flange including the bolt; and bellows expanding/contracting means for expanding and contracting the bellows so as to separate only the cell assembly from a vacuum chamber with entire vacuum maintained in the vacuum chamber and local vacuum released in the cell assembly;

the epitaxial apparatus further comprising opening and closing means located between an entrance flange of the vacuum chamber and an upper adaptor flange of the adaptor for maintaining vacuum in the vacuum chamber and introducing the vacuum in the vacuum chamber.

2. An effusion according to claim 1, wherein said opening and closing means comprises a gate valve.

3. An effusion cell according to claim 1, wherein said vacuum chamber is shut from outside, even though the gate valve is open.

4. An effusion cell according to claim 1, wherein said bellows expanding/contracting means comprises:

the bolt having one end connected to the supporting plate and the other end passing the cell flange for expanding and contracting the bellows according to a variable action of the bolt;

a control supporting plate fixed below the cell flange and having a through hole for the bolt; and a control nut coupled under the control supporting plate for controlling an inserted length of the bolt according to a rotational direction of the control nut.

5. An effusion cell according to claim 1, further comprising guiding means having one end connected to the supporting plate and the other end passing through the control supporting plate for guiding a linear movement of the bolt.

* * * * *